US005804906A

United States Patent [19]

Tsutsumi

[11] Patent Number: 5,804,906

[45] Date of Patent: *Sep. 8, 1998

[54] SOUND GENERATING DEVICE

[75] Inventor: Shigeru Tsutsumi, Yonezawa, Japan

[73] Assignee: Shinsei Corporation, Yamagata, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 581,628

[22] PCT Filed: May 17, 1995

[86] PCT No.: PCT/JP95/00940

§ 371 Date: Jan. 18, 1996

§ 102(e) Date: Jan. 18, 1996

[87] PCT Pub. No.: WO95/32602

PCT Pub. Date: Nov. 30, 1995

[30] Foreign Application Priority Data

| | | | |
|---|---|---|---|
| May 20, 1994 | [JP] | Japan | 6-106921 |
| Jul. 1, 1994 | [JP] | Japan | 6-150931 |

[51] Int. Cl.[6] ........ H04R 17/00; H01L 41/08

[52] U.S. Cl. ........ 310/322; 310/328; 310/331; 310/337; 310/348

[58] Field of Search ........ 310/322, 326, 310/328, 330–332, 334, 345, 348, 352–354

[56] References Cited

U.S. PATENT DOCUMENTS

| | | | |
|---|---|---|---|
| 3,287,692 | 11/1966 | Turner | 340/10 |
| 3,535,471 | 10/1970 | Schafft | 310/334 |
| 3,947,644 | 3/1976 | Uchikawa | 310/332 |
| 4,401,911 | 8/1983 | Ravinet et al. | 310/334 |
| 4,475,014 | 10/1984 | King | 310/332 |
| 4,485,322 | 11/1984 | Yasuda et al. | 310/332 |
| 4,597,099 | 6/1986 | Sawafuji | 310/322 |
| 4,607,186 | 8/1986 | Takayama et al. | 310/324 |
| 4,641,054 | 2/1987 | Takahata et al. | 310/324 |
| 4,700,177 | 10/1987 | Nakashima et al. | 340/388 |
| 4,751,419 | 6/1988 | Takahata | 310/324 |
| 4,811,816 | 3/1989 | Lin | 181/160 |
| 4,876,675 | 10/1989 | Ogura et al. | 310/337 |
| 4,996,713 | 2/1991 | Bittencourt | 310/332 |
| 5,196,755 | 3/1993 | Shields | 310/324 |
| 5,598,050 | 1/1997 | Bowen et al. | 310/322 |

FOREIGN PATENT DOCUMENTS

| | | | |
|---|---|---|---|
| 58-43096 | 3/1983 | Japan | H04R 17/00 |
| 58-48200 | 3/1983 | Japan | H04R 17/00 |
| 61-150500 | 7/1986 | Japan | H04R 17/00 |
| 63-314996 | 12/1988 | Japan | 310/330 |

*Primary Examiner*—Thomas M. Dougherty
*Attorney, Agent, or Firm*—Kenyon & Kenyon

[57] ABSTRACT

A driving device (14) of an acoustic vibration plate (11) is arranged between a speaker frame (10) and the acoustic vibration plate (11). The driving device (14) is comprised of a pair of piezoelectric vibration plates (1, 2) arranged facing each other across a certain distance. The outer peripheries of the piezoelectric vibration plates (1, 2) are connected to each other by an annular spacer (7). When a drive signal is applied to the piezoelectric vibration plates (1, 2), the piezoelectric vibration plates (1, 2) repeatedly undergo flexing motion wherein their centers flex alternately in opposite directions. At this time, the flexing directions of the piezoelectric vibration plates (1, 2) are always reverse to each other.

38 Claims, 21 Drawing Sheets

SOUND GENERATING DEVICE

TECHNICAL FIELD

The present invention relates to a sound generating device.

BACKGROUND ART

As piezoelectric vibration plates, there are known unimorphs comprised of a disk-shaped thin metal plate with a piezoelectric ceramic layer formed on just one side and bimorphs comprised of a disk-shaped thin metal plate with piezoelectric ceramic layers formed on both sides. These unimorph and bimorph type piezoelectric vibration plates perform flexing oscillation wherein the centers of the piezoelectric vibration plates alternately flex in opposite directions when the voltage applied to the piezoelectric ceramic layers is changed. Known in the art is a speaker which uses such a flexing oscillation of a piezoelectric vibration plate to generate sound. In such a conventional speaker, the peripheral portion of the piezoelectric vibration plate was usually supported by the frame of the speaker, the center of the piezoelectric vibration plate was connected to an acoustic vibration plate, and the acoustic vibration plate was made to oscillate by the piezoelectric vibration plate so as to produce sound from the acoustic vibration plate (for example, see Japanese Unexamined Patent Publication (Kokai) No. 60-182300).

This piezoelectric vibration plate, however, has a high natural frequency and a high Q value at the resonance point and has the property of a reduction in the sound pressure level along with a fall in the frequency. Accordingly, there is the problem that when, like in the past, the oscillation of the piezoelectric vibration plate is merely directly transmitted to the acoustic vibration plate as it is, the sound becomes distorted and the bass sound pressure level is insufficient at the resonance point.

DISCLOSURE OF THE INVENTION

The object of the present invention is to provide a sound generating device which is able to give a sufficiently high sound pressure level even in the bass region.

According to the present invention, there is provided a sound generating device provided with a driving device having a plurality of piezoelectric vibration plates which are arranged spaced from each other in an axial direction, wherein either of the peripheral portions or centers of adjacent piezoelectric vibration plates are connected to each other and adjacent piezoelectric vibration plates are made to flex in opposite directions from each other, the piezoelectric vibration plate positioned at one end of said plurality of piezoelectric vibration plates being connected to an acoustic vibration plate.

BEST MODE FOR CARRYING OUT THE INVENTION

Figure 1:
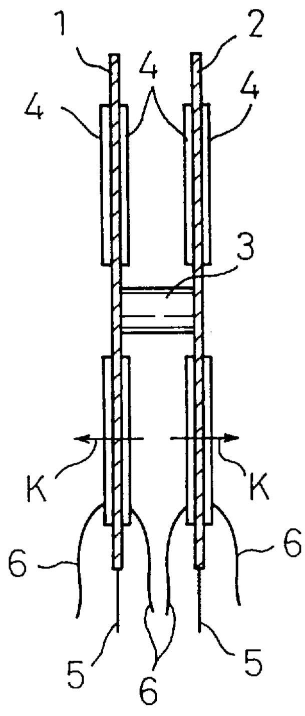
FIG. 1 is a cross-sectional side view of a type I module.
Figure 2:
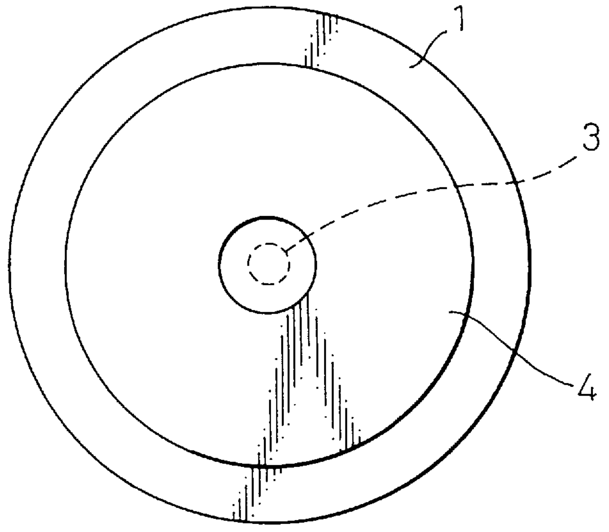
FIG. 2 is a front view of the module shown in FIG. 1.

FIG. 1 and FIG. 2 show an example of a driving device for driving an acoustic vibration plate of a sound generating device. Referring to FIG. 1 and FIG. 2, the driving device is comprised of a pair of disk-shaped metal piezoelectric vibration plates 1 and 2 arranged facing each other across a certain distance in the axial direction. The centers of these piezoelectric vibration plates 1 and 2 are connected to each other by a metal or plastic connecting rod 3. On the two sides of each of the piezoelectric vibration plates 1 and 2 are formed annular piezoelectric ceramic layers 4. Accordingly, in the example shown in FIG. 1 and FIG. 2, the piezoelectric vibration plates 1 and 2 are comprised of bimorphs.

FIG. 1 shows the directions of polarization of the piezoelectric ceramic layers 4 of the piezoelectric vibration plates 1 and 2 by the arrows K. As shown in FIG. 1, in the example shown in FIG. 1, the piezoelectric vibration plates 1 and 2 are connected by the connecting rod 3 so that the direction of polarization K of the piezoelectric ceramic layers 4 of one piezoelectric vibration plate 1 becomes reverse from the direction of polarization K of the piezoelectric ceramic layers 4 of the other piezoelectric vibration plate 2. The piezoelectric vibration plate 2 is for example grounded through a lead wire 5. An identical driving voltage is applied through the lead wires 6 to thin film electrodes formed on the surfaces of the piezoelectric ceramic layers 4.

Figure 3A:
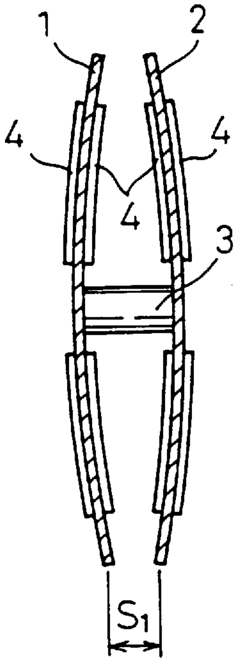
FIGS. 3(A), 3(B) are views for explaining the operation of the module shown in FIG. 1.

When a voltage is applied to the thin film electrodes of the piezoelectric ceramic layers 4 of the piezoelectric vibration plates 1 and 2, the piezoelectric ceramic layers 4 formed on one side of the piezoelectric vibration plates 1 and 2 extend in the radial direction, while the piezoelectric ceramic layers 4 formed on the other side contract. As a result, the piezoelectric vibration plates 1 and 2 flex. In the example shown in FIG. 1, as mentioned above, the directions of polarization K of the piezoelectric ceramic layers 4 of the piezoelectric vibration plates 1 and 2 are reverse from each other. In this case, when a positive voltage and negative voltage are alternately applied through the lead wires 6 to the thin film electrodes of the piezoelectric ceramic layers 4, the piezoelectric vibration plates 1 and 2 flex in reverse directions from each other as shown in FIG. 3(A) and (B). That is, the state of the piezoelectric vibration plates 1 and 2 flexing outward to form a convex shape as shown in FIG. 3(A) and the state of the piezoelectric vibration plates 1 and 2 flexing inward to form a concave shape as shown in FIG. 3(B) are alternately repeated.

Figure 3B:
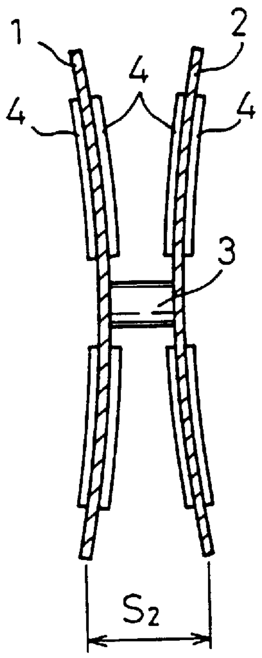

In this case, if the distance between the peripheral portions of the piezoelectric vibration plates 1 and 2 in the state shown in FIG. 3(A) is made $S_1$ and the distance between the peripheral portions of the piezoelectric vibration plates 1 and 2 in the state shown in FIG. 3(B) is made $S_2$, then amount of displacement $\Delta S$ of the peripheral portions of the piezoelectric vibration plates 1 and 2 becomes $\Delta S=S_2-S_1$. Accordingly, if the amount of displacement is used as the output of the driving device, the stroke of the output of the driving device becomes $\Delta S$ ($=S_2-S_1$). This stroke is double the stroke obtained when using a single piezoelectric vibration plate. Accordingly, in the driving device shown in FIG. 1, it is possible to produce an output of the stroke double that in the case of use of a single piezoelectric vibration plate.

In this way, it is possible to increase the output stroke by use of a pair of piezoelectric vibration plates 1 and 2. The pair of piezoelectric vibration plates 1 and 2 shown in FIG. 1 in this case shows the smallest unit of combination of piezoelectric vibration plates enabling increase of the output stroke. This smallest unit of combination is referred to as a "module". Note that the module obtained by connecting the centers of the pair of the piezoelectric vibration plates 1 and 2 as shown in FIG. 1 is referred to below as a "type I module".

Figure 4:
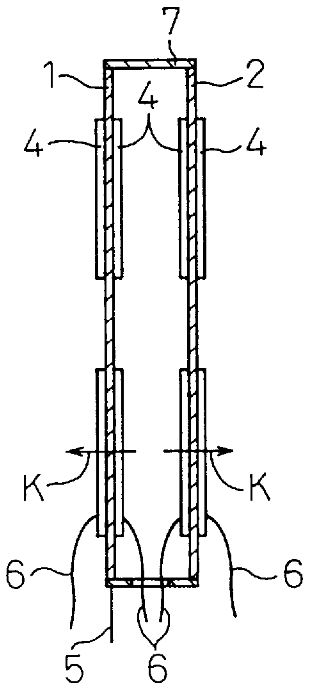
FIG. 4 is a cross-sectional side view of a type II module.
Figure 5:
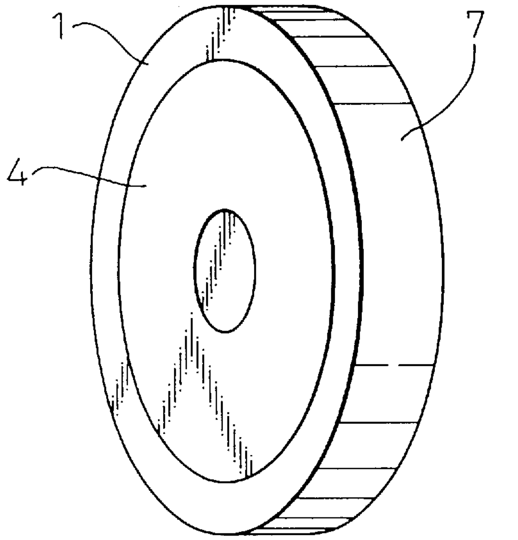
FIG. 5 is perspective view of the module shown in FIG. 4, FIGS. 6(A), 6(B) are views for explaining the operation of the module shown in FIG. 4.

FIG. 4 and FIG. 5 show a module of a construction different from the module shown in FIG. 1. Note that in FIG. 4 and FIG. 5, constituent elements similar to those of FIG. 1 are shown by the same reference numerals.

Referring to FIG. 4 and FIG. 5, the outer peripheries of the pair of piezoelectric vibration plates 1 and 2 are affixed to a metal annular spacer 7 extending along the outer peripheries of the piezoelectric vibration plates 1 and 2. Accordingly, in the example shown in FIG. 4 and FIG. 5, the pair of piezoelectric vibration plates 1 and 2 are connected to each other through the annular spacer 7. In the example shown in FIG. 4 and FIG. 5 as well, the direction of polarization K of the piezoelectric ceramic layers 4 of one piezoelectric vibration plate 1 is reverse to that of the direction of polarization K of the piezoelectric ceramic layers 4 of the other piezoelectric vibration plate 2 and an identical drive voltage is applied through the lead wires 6 to the thin film electrodes of the piezoelectric ceramic layers 4. Accordingly, in this case too, when a positive voltage and negative voltage are alternately applied to the thin film electrodes of the piezoelectric ceramic layers 4, the piezoelectric vibration plates 1 and 2 flex alternately in reverse directions as shown by FIG. 6(A) and 6(B).

Figure 6A:
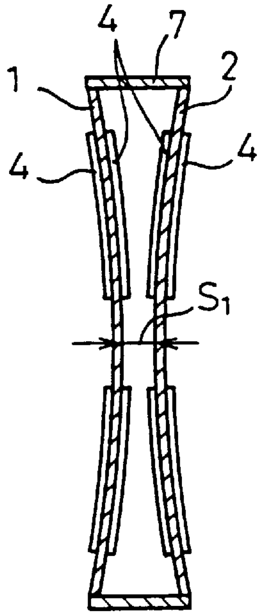
Figure 6B:
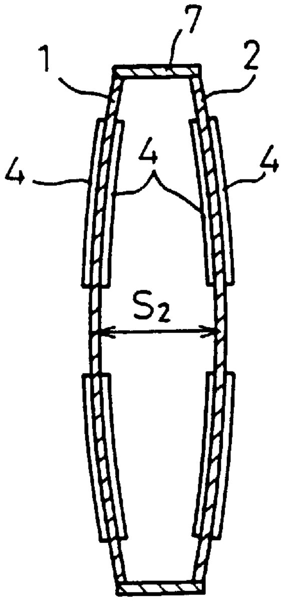

In this case, if the distance between the centers of the piezoelectric vibration plates 1 and 2 in the state shown in FIG. 6(A) is made $S_1$ and the distance between the centers of the piezoelectric vibration plates 1 and 2 in the state shown in FIG. 6(B) is made $S_2$, then the amount of displacement $\Delta S$ of the centers of the piezoelectric vibration plates 1 and 2 becomes $\Delta S=S_2-S_1$. Accordingly, if the amount of displacement is used as the output of the driving device, the stroke of the output of the driving device becomes $\Delta S$ ($=S_2-S_1$). This stroke is double the stroke obtained when using a single piezoelectric vibration plate. Accordingly, in the driving device shown in FIG. 4, it is possible to produce an output of the stroke double that in the case of use of a single piezoelectric vibration plate. Note that the module obtained by connecting the peripheral portions of the pair of the piezoelectric vibration plates 1 and 2 as shown in FIG. 4 is referred to below as a "type II module".

Figure 7:
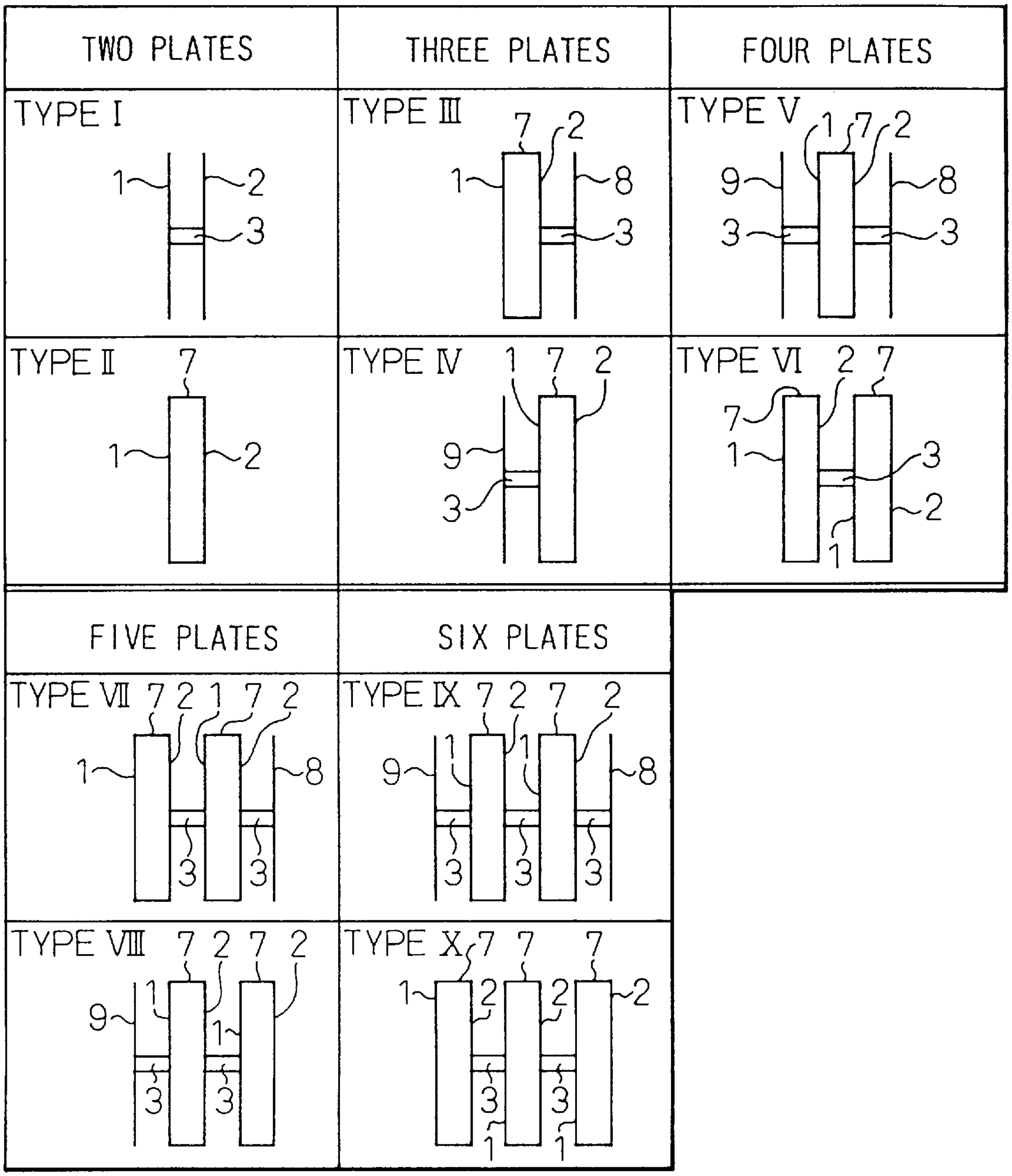
FIG. 7 is view showing various driving devices.

The representative modules in the case of use of a pair of piezoelectric vibration plates 1 and 2 are the type I module and type II module explained above. These modules may be used as the basis for preparing driving devices comprised of various combinations of three or more piezoelectric vibration plates. Typical examples of these driving devices are shown in FIG. 7. Note that in FIG. 7, the driving devices shown in the column with two piezoelectric vibration plates are the type I module and type II module explained above.

Referring to FIG. 7, the driving devices comprised of combinations of three piezoelectric vibration plates are shown as type III and type IV. The driving device shown by type III is a combination of the type II module with a single piezoelectric vibration plate 8 and is formed by connecting the center of the piezoelectric vibration plate 2 constituting part of the type II module with the center of the single piezoelectric vibration plate 8 by a connecting rod 3. In this driving device, when a drive voltage is applied, the piezoelectric vibration plate 2 and the piezoelectric vibration plate 8 flex in reverse directions from each other. Therefore, this driving device gives an output stroke three times the output stroke when using a single piezoelectric vibration plate.

The driving device shown by type IV is also a combination of a type II module and a single piezoelectric vibration plate 9 and is formed by connecting the center of the piezoelectric vibration plate 1 constituting part of the type II module and the center of the single piezoelectric vibration plate 9 by a connecting rod 3. In this driving device as well, when a drive voltage is applied, the piezoelectric vibration plate 1 and the piezoelectric vibration plate 9 flex in reverse directions from each other and therefore this driving device also gives an output stroke three times the output stroke when using a single piezoelectric vibration plate.

On the other hand, as shown in FIG. 7, the driving devices comprising combinations of four piezoelectric vibration plates are shown as type V and type VI. The driving device shown by type V is a combination of the type II module and two piezoelectric vibration plates 8 and 9. Seen in another way, a type II module is inserted between the pair of piezoelectric vibration plates 1 and 2 of a type I module. That is, this driving device is formed by connecting the center of one piezoelectric vibration plate 1 constituting part of the type II module and the center of the piezoelectric vibration plate 9 by a connecting rod 3 and connecting the other piezoelectric vibration plate 2 constituting the type II module and the center of the piezoelectric vibration plate 8 by a connecting rod 3. In this driving device, when a drive voltage is applied, the piezoelectric vibration plate 1 and the piezoelectric vibration plate 9 flex in opposite directions to each other and the piezoelectric vibration plate 2 and the piezoelectric vibration plate 8 flex in opposite directions to each other, so an output stroke four times the output stroke when using a single piezoelectric vibration plate can be obtained.

On the other hand, the driving device shown by type VI is a combination of two type II modules and is formed by connecting the centers of the piezoelectric vibration plates 1 and 2 of the modules facing each other by a connecting rod 3. In this driving device too, it is possible to obtain a stroke four times the output stroke when using a single piezoelectric vibration plate.

Further, as shown in FIG. 7, driving devices comprising combinations of five piezoelectric vibration plates are shown as type VII and type VIII. Driving devices comprising combinations of six piezoelectric vibration plates are shown as type IX and type X. The configurations of the type VII, VIII, IX, and X driving devices are clear from FIG. 7, so no particular explanation will be made, but in each of the driving devices of the type VII, VIII, IX, and X, the mutually adjoining piezoelectric vibration plates 1, 2, 8, and 9 flex in mutually opposite directions when a drive voltage is applied. Accordingly, in the type VII and VIII driving devices, an output stroke five times the output stroke when using a single piezoelectric vibration plate is obtained, while in the type IX and X driving devices, an output stroke six times the output stroke when using a single piezoelectric vibration plate is obtained. Note that while not shown in FIG. 7, it is possible to form a driving device comprising seven or more piezoelectric vibration plates in a similar way.

Next, an explanation will be made of representative examples of the sound generating device using the driving devices shown in FIG. 7 to drive the acoustic vibration plate.

Figure 8:
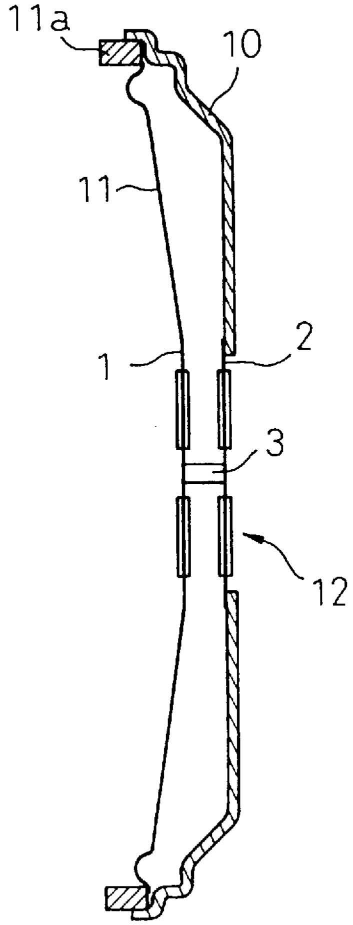
FIG. 8 is a cross-sectional side view of a speaker using the type I module shown in FIG. 1.
Figure 9:
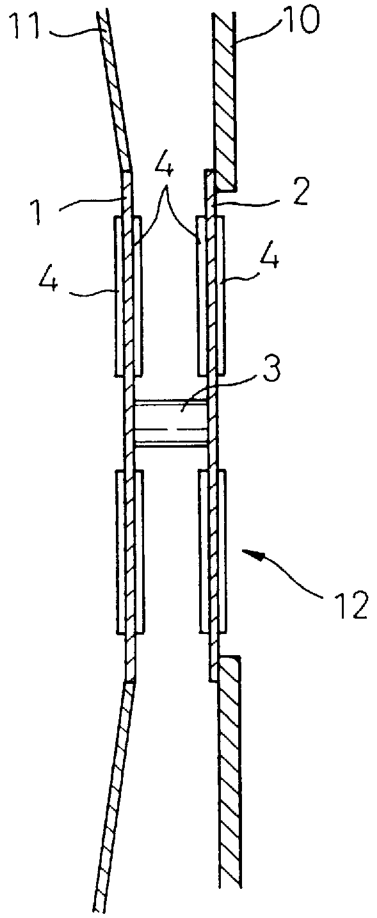
FIG. 9 is a partially enlarged cross-sectional side view of FIG. 8.

FIG. 8 and FIG. 9 show the case of application of the present invention to a speaker and use of the type I module shown in FIG. 1 as a driving device for the speaker.

Referring to FIG. 8 and FIG. 9, reference numeral 10 shows a speaker frame and 11 an acoustic vibration plate. The outer periphery of the acoustic vibration plate 11 is bonded to the outer periphery of the speaker frame 10. Further, a packing 11*a* is bonded on the outer periphery of the acoustic vibration plate 11. In the embodiment shown in FIG. 8 and FIG. 9, the acoustic vibration plate 11 is formed from cone paper, but the acoustic vibration plate 11 may be formed from wood, plastic, or a thin metal sheet. The inner periphery of the acoustic vibration plate 11 is connected to the outer periphery of one of the piezoelectric vibration plates 1 of the driving device 12, while the outer periphery of the other piezoelectric vibration plate 1 of the driving device 12 is connected to the speaker frame 10.

As explained at the start, a piezoelectric vibration plate has a high natural frequency and the sound pressure level falls as this frequency falls. In the embodiment shown in FIG. 8 and FIG. 8, however, the drive stroke given by the driving device 12 to the acoustic vibration plate 11 becomes twice that when using a single acoustic vibration plate, so the amplitude of the acoustic vibration plate 11 becomes larger even in the low frequency region and therefore the bass sound pressure level can be made higher.

Further, if the pair of piezoelectric vibration plates 1 and 2 are connected with each other by a connecting rod 3, the natural frequency of the driving device 12 becomes considerably lower than the natural frequency of the piezoelectric vibration plates and as a result the resonance point moves to the low frequency side. Accordingly, from this viewpoint as well, the amplitude of the acoustic vibration plate at the low frequency region can be made larger and therefore the bass sound pressure level can be raised much higher.

Figure 10:
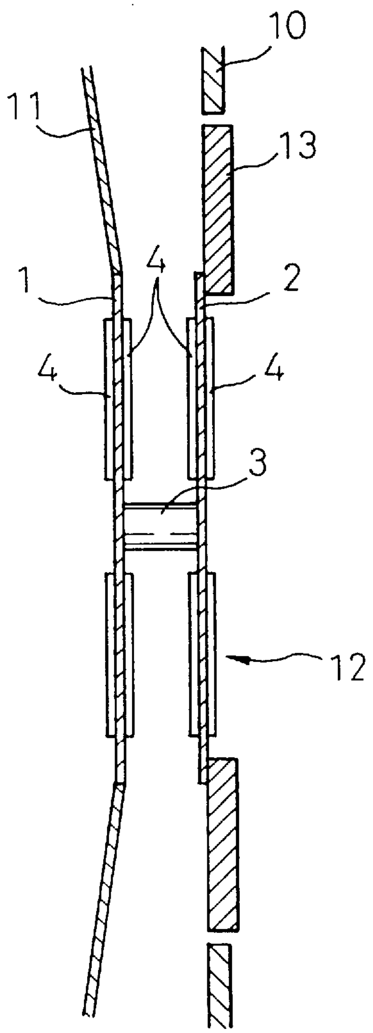
FIG. 10 is a cross-sectional side view of part of a speaker showing another embodiment.

FIG. 10 shows another embodiment. As shown in FIG. 10, in this embodiment, to lower the natural frequency of the driving device 13 and further to make the sound pressure level flat over a wide frequency region, an annular elastic member 13 comprised of rubber is attached to the outer periphery of the piezoelectric vibration plate 2. That is, as shown in FIG. 10, since the elastic member 13 has a relatively large mass, it is possible to further reduce the natural frequency of the driving device 13 and therefore to further raise even the bass sound pressure level. Further, if the natural frequency of the driving device 13 is reduced, the resonance point appears at the bass region, but the elastic member 13 functions to reduce the Q value at this resonance point and to reduce the Q value at the next higher resonance point appearing in the high frequency region.

That is, since the elastic member 13 has a relatively large mass as explained above, this elastic member 13 acts to suppress the movement of the peripheral portion of the piezoelectric vibration plate 2 in the forward-reverse direction due to its inertia. Accordingly, as shown in FIG. 10, even if the elastic member 13 is not supported by the speaker frame 10, the acoustic vibration plate 11 is made to oscillate when the piezoelectric vibration plates 1 and 2 engage in flexing motion. When the speed of flexing motion of the piezoelectric vibration plate 2 is slow, however, that is, in the low frequency region, the elastic member 13 moves as a whole in accordance with the movement of the peripheral portion of the piezoelectric vibration plate 2. As opposed to this, when the speed of flexing motion of the piezoelectric vibration plate 2 is fast, that is, in the high frequency region, the elastic member 13 as a whole cannot follow the movement of the peripheral portion of the piezoelectric vibration plate 2 and therefore the movement of the outer periphery of the elastic member 13 lags behind the movement of the inner periphery of the elastic member 13. As a result, the elastic member 13 deforms. This deformation motion is repeated.

This deformation of the elastic member 13 occurs due to the vibration energy and therefore the larger the amount of deformation of the elastic member 13, the greater the vibration energy consumed to cause the deformation of the elastic member 13. In other words, the larger the amount of deformation of the elastic member 13, the greater the vibration energy absorbed by the elastic member 13. However, as explained above, the amount of deformation of the elastic member 13 becomes greater the higher the frequency. Accordingly, as shown in FIG. 10, if the elastic member 13 is attached to the piezoelectric vibration plate 2, it becomes possible to attenuate the high frequency vibration by this elastic member 13. As a result, it is possible to relatively increase the amplitude of the low frequency region and therefore to raise the bass sound pressure level.

On the other hand, at the resonance point, not only does the amplitude become larger, but also the speed of flexing motion of the piezoelectric vibration plate 2 becomes faster and therefore the oscillation at the resonance point is attenuated by the elastic member 13. Accordingly, if the elastic member 13 is attached to the piezoelectric vibration plate 2, the Q value becomes smaller and therefore the sound pressure level can be made flat over a wide frequency region.

Figure 11:
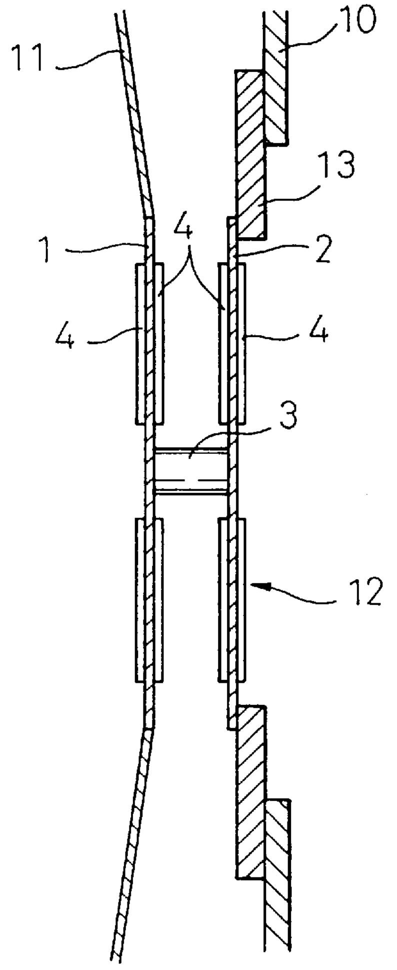
FIG. 11 is a cross-sectional side view of part of a speaker showing still another embodiment.

FIG. 11 shows still another embodiment. In this embodiment, the outer periphery of the annular elastic member 13 is affixed to the speaker frame 10. If the outer periphery of the elastic member 13 is affixed to the speaker frame 10 in this way, the amount of deformation of the elastic member 13 at the time of occurrence of high frequency oscillation becomes further greater and therefore it becomes possible to further attenuate the high frequency oscillation and possible to further reduce the Q value. Also, if the outer periphery of the elastic member 13 is affixed to the speaker frame 10, it becomes possible to greatly suppress the amount of movement of the outer periphery of the piezoelectric vibration plate 2 in the forward-reverse direction at the time of occurrence of low frequency oscillation. As a result, it is possible to increase the amplitude of the acoustic vibration plate 11 at the low frequency region and therefore to increase the bass sound pressure level.

Figure 12:
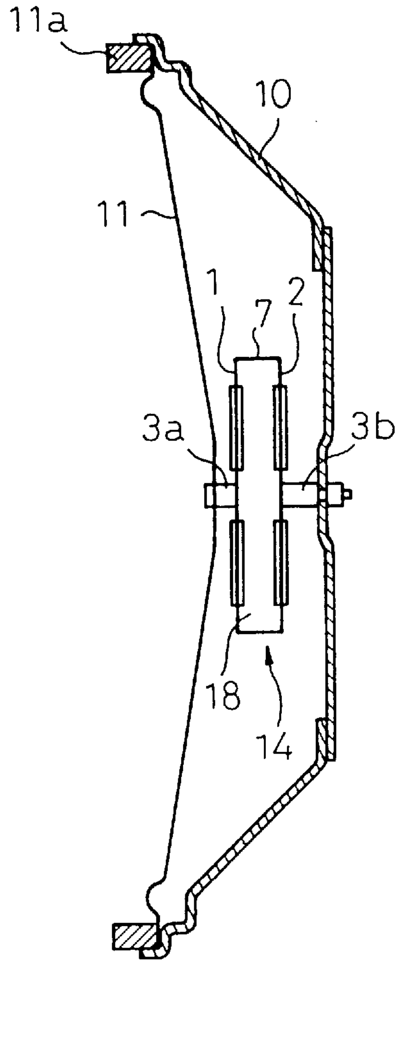
FIG. 12 is a cross-sectional side view of a speaker using the type II speaker shown in FIG. 4.
Figure 13:
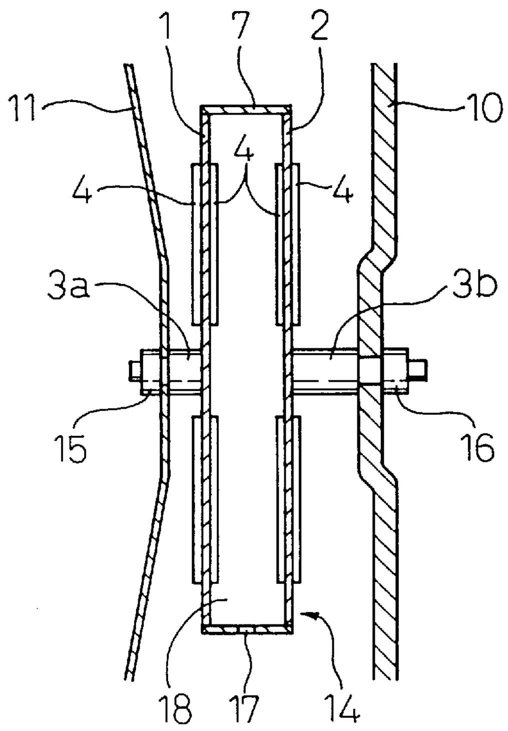
FIG. 13 is a partially enlarged cross-sectional side view of FIG. 12.
Figure 14:
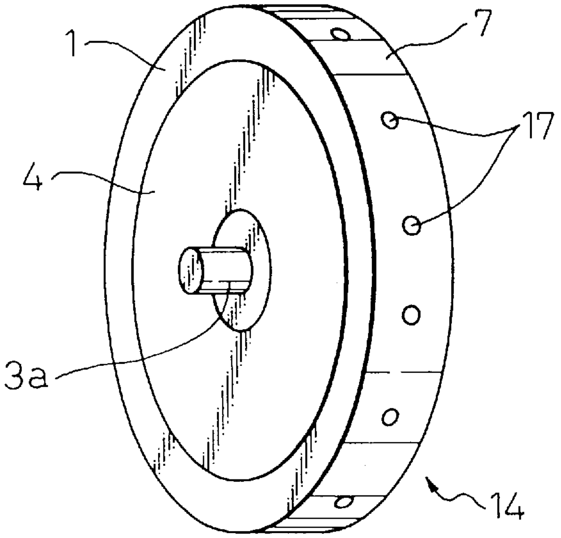
FIG. 14 is a perspective view of the type II module.

FIG. 12 to FIG. 14 show the case of use of the module of the type II shown in FIG. 4 as the driving device of a speaker.

Referring to FIG. 12 and FIG. 13, the driving device 14 comprised of a module of type II is arranged between the acoustic vibration plate 11 and the speaker frame 10. The center of one piezoelectric vibration plate 1 constituting the type II module is connected to the center of the acoustic vibration plate 11 through a metal or plastic connecting rod 3*a* by for example a nut 15, while the center of the other piezoelectric vibration plate 2 constituting the type II module is connected to the speaker frame 10 through a metal or plastic connecting rod 3*b* by for example the nut 16. In this embodiment too, the drive stroke given by the driving device 14 to the acoustic vibration plate 11 becomes double that when using a single piezoelectric vibration plate, so the amplitude of the acoustic vibration plate 11 becomes larger even in the low frequency region and therefore it is possible to raise the bass sound pressure level.

Further, when the pair of piezoelectric vibration plates 1 and 2 are connected to each other by an annular spacer 7 as in this embodiment, the natural frequency of the driving device 14 becomes considerably lower than the natural frequency of the piezoelectric vibration plates and, as a result, the resonance point moves to the low frequency side. Accordingly, from this viewpoint as well, it is possible to increase the amplitude of the acoustic vibration plate 11 in the low frequency region and therefore the bass sound pressure level is raised much higher. Further, in this embodiment, to make the natural frequency of the driving device 13 lower and to make the sound pressure level flat over a wide frequency region, a plurality of communicating holes 17 are formed in the annular spacer 7 and an air damper chamber 18 communicating through these communicating holes 17 to the outside air is formed between the pair of piezoelectric vibration plates.

If the air damper chamber 18 increases in volume due to the flexing motion of the piezoelectric vibration plates 1 and 2, outside air flows through the communicating holes 17 into the air damper chamber 18, while if the air damper chamber 18 decreases in volume, air in the air damper chamber 18 flows out to the outside air through the communicating holes 17. In this case, time is required for the inflowing and outflowing action of the air through the communicating holes 17, so the faster the speed of flexing motion of the piezoelectric vibration plates 1 and 2, that is, the higher the frequency of vibration, the harder it becomes for the piezoelectric vibration plates 1 and 2 to flex. That is, if the piezoelectric vibration plates 1 and 2 attempt to flex outward to give a convex shape as shown in FIG. 6(B), the pressure inside the air damper chamber 18 falls, so the flexing motion of the piezoelectric vibration plates 1 and 2 is suppressed, while when the piezoelectric vibration plates 1 and 2 attempt to flex inward to give a concave shape as shown in FIG. 6(A), the pressure inside the air damper chamber 18 rises, so the flexing motion of the piezoelectric vibration plates 1 and 2 is suppressed. In this way, due to the damper action of the air damper chamber 18, the faster the speed of flexing motion of the piezoelectric vibration plates 1 and 2, the more the flexing motion of the piezoelectric vibration plates 1 and 2 is suppressed. In other words, the faster the speed of flexing motion of the piezoelectric vibration plates 1 and 2, that is, the higher the frequency of oscillation, the more the oscillation of the piezoelectric vibration plates 1 and 2 is suppressed. Accordingly, by providing such an air damper chamber 18, it is possible to relatively increase the bass sound pressure level and further reduce the Q value at the resonance point, so it is possible to make the sound pressure level flat over a wide frequency region.

Figure 15:
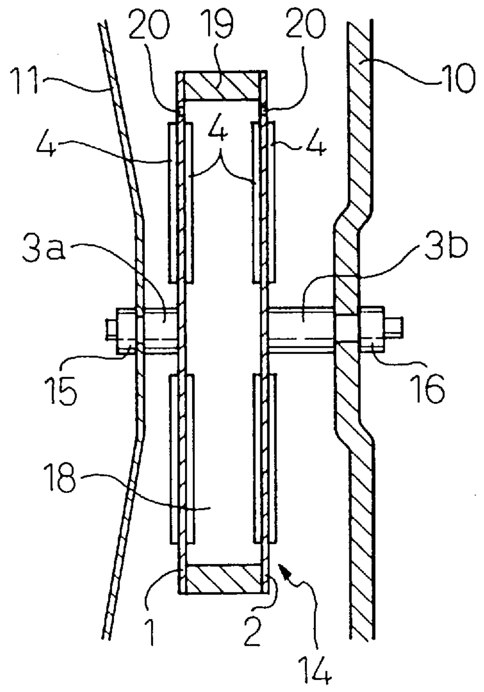
FIG. 15 is a cross-sectional side view of part of a speaker showing another embodiment.

FIG. 15 shows still another embodiment. In this embodiment, the annular spacer 19 connecting the peripheral portions of the piezoelectric vibration plates 1 and 2 together is formed from an elastic member such as rubber and a plurality of communicating holes 20 communicating the air damper chamber 18 with the outside air are formed in the peripheral portions of the piezoelectric vibration plates 1 and 2. Accordingly, in this embodiment too, it is possible to relatively raise the bass sound pressure level by the attenuation action of the air damper chamber 18 on the high frequency oscillation and possible to make the sound pressure level flat over a wide frequency region. Further, in this embodiment, the higher the frequency, the greater the frequency of deformation of the elastic member 19, so the higher the frequency, the greater the amount of absorption of oscillation by the elastic member 19. Accordingly, in this embodiment, it is possible to further cause the high frequency oscillation to attenuate.

Figure 16:
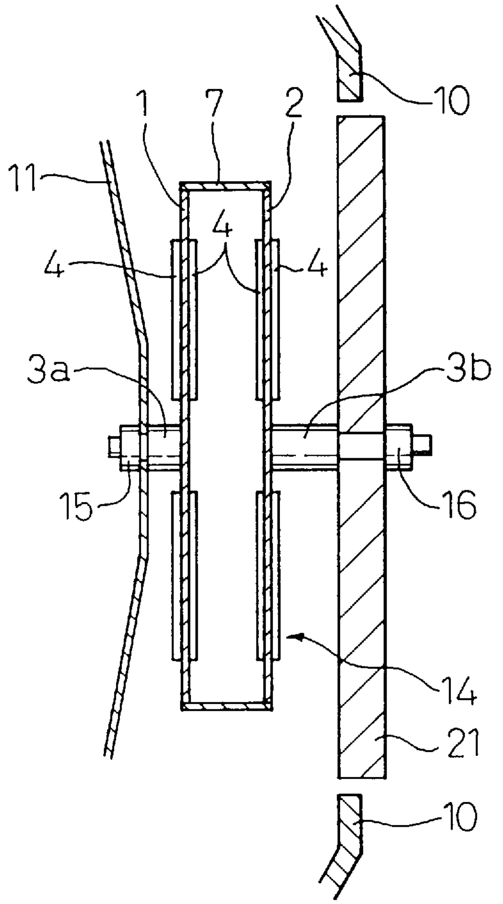
FIG. 16 is a cross-sectional side view of part of a speaker showing still another embodiment.

FIG. 16 shows still another embodiment. Referring to FIG. 16, in this embodiment, the center of the elastic plate 21 comprised of rubber is connected to the center of the piezoelectric vibration plate 2 through a connecting rod 3*b* by a nut 16. This elastic plate 21 acts in a similar way as the elastic member 13 shown in FIG. 10.

That is, the elastic plate 21 has a relatively large mass and therefore the elastic plate 21 acts to suppress the movement of the center of the piezoelectric vibration plate 2 in the forward-reverse direction by its inertia. Accordingly, as shown in FIG. 16, even if the elastic plate 21 is not supported by the speaker frame 10, the acoustic vibration plate 11 is made to vibrate when the piezoelectric vibration plates 1 and 2 engage in flexing motion. On the other hand, when the speed of flexing motion of the piezoelectric vibration plates 1 and 2 is slow, that is, in the low frequency region, the elastic body 21 moves as a whole in accordance with the movement of the center of the piezoelectric vibration plate 2. As opposed to this, when the speed of flexing motion of the piezoelectric vibration plates 1 and 2 is fast, that is, in the high frequency region, the elastic body 21 as a whole cannot follow the movement of the center of the piezoelectric vibration plate 2 and therefore the movement of the outer periphery of the elastic body 21 lags behind the movement of the center of the elastic body 21. As a result, the elastic body 21 deforms and this deformation motion is repeated.

In this case, however, the larger the amount of deformation of the elastic plate 21, the larger the vibration energy absorbed by the elastic plate 21. The amount of deformation of the elastic plate 21 shown in FIG. 16 becomes larger the higher the frequency. Accordingly, as shown in FIG. 16, if the elastic plate 21 is attached to the piezoelectric vibration plate 2, it is possible to cause the high frequency oscillation to attenuate by the elastic plate 21. As a result, it becomes possible to relatively increase the amplitude at the low frequency region and therefore to raise the bass sound pressure level.

Further, as explained above, not only does the amplitude become larger at the resonance point, but also the speed of the flexing motion of the piezoelectric vibration plates 1 and 2 increases. Therefore, the oscillation at the resonance point is attenuated by the elastic plate 21. Accordingly, if the elastic plate 21 is attached to the piezoelectric vibration plate 2, the Q value becomes smaller and therefore it is possible to make the sound pressure level flat over a wide frequency region.

Figure 17:
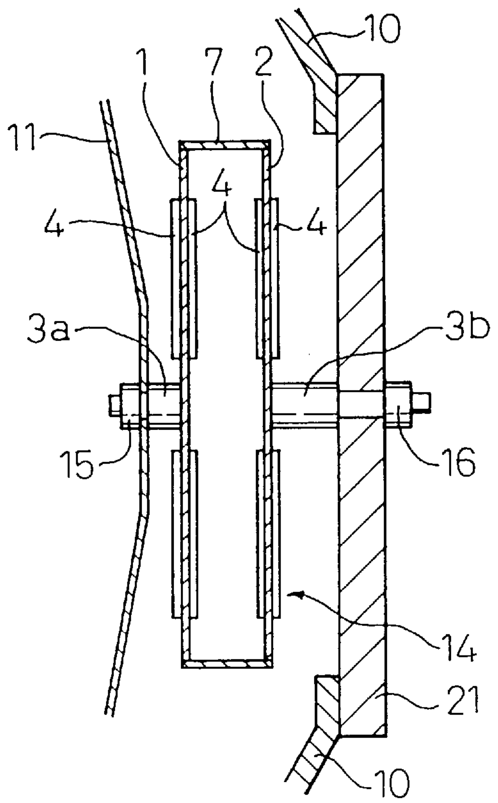
FIG. 17 is a cross-sectional side view of part of a speaker showing still another embodiment.

FIG. 17 shows still another embodiment. In this embodiment, the outer periphery of the elastic plate 21 is affixed to the speaker frame 10. If the outer periphery of the elastic plate 21 is affixed to the speaker frame 10 in this way, the amount of deformation of the elastic plate 21 at the time of occurrence of high frequency oscillation becomes larger and therefore it is possible to further cause the high frequency oscillation to attenuate and further cause the Q value to fall. Also, if the outer periphery of the elastic plate 21 is affixed to the speaker frame 10, the amount of movement of the center of the piezoelectric vibration plate 2 in the forward-reverse direction at the time of occurrence of low frequency oscillation on can be suppressed to a large extent. As a result, it is possible to increase the amplitude of the acoustic vibration plate 11 in the low frequency region and therefore to increase the bass sound pressure level.

Up to now, the present invention has been explained in relation to the case of application to a driving device 12 comprised of type I module and a driving device 14 comprised of the type II module, but the constructions of the embodiments explained up to here may be applied to the various driving devices of the constructions shown as type III to type X in FIG. 7. Below, an explanation will be made of typical examples of application of the constructions of the embodiments explained above to driving devices of the constructions shown as type III to type X.

Figure 18:
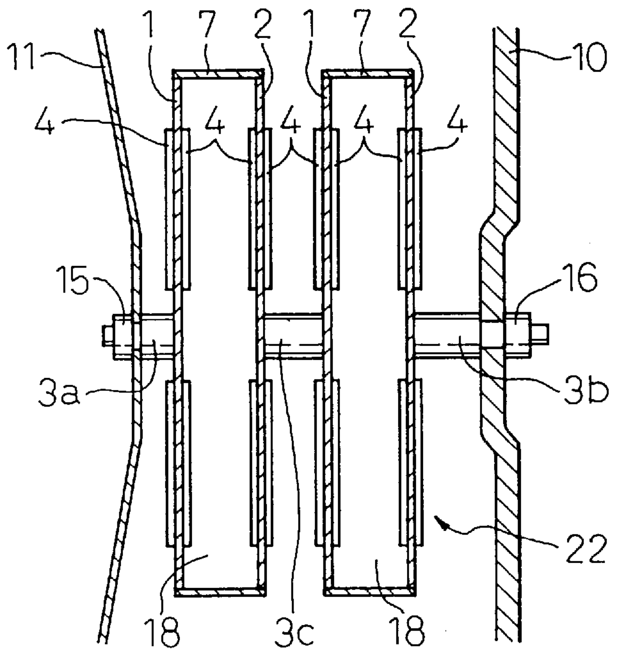
FIG. 18 is a cross-sectional side view of part of a speaker showing still another embodiment.

FIG. 18 shows the case of use of the driving device of the type VI shown in FIG. 7 as the driving device of a speaker. That is, in the embodiment shown in FIG. 18, the driving device 22 has a construction of two modules of type II shown in FIG. 4 connected in series. The centers of the two piezoelectric vibration plates positioned at the center among the four piezoelectric vibration plates 1 and 2 are connected to each other by a connecting rod 3*c*. In this embodiment, as explained above, it is possible to obtain an output stroke four times that of the case of use of a single piezoelectric vibration plate as mentioned above.

Figure 19:
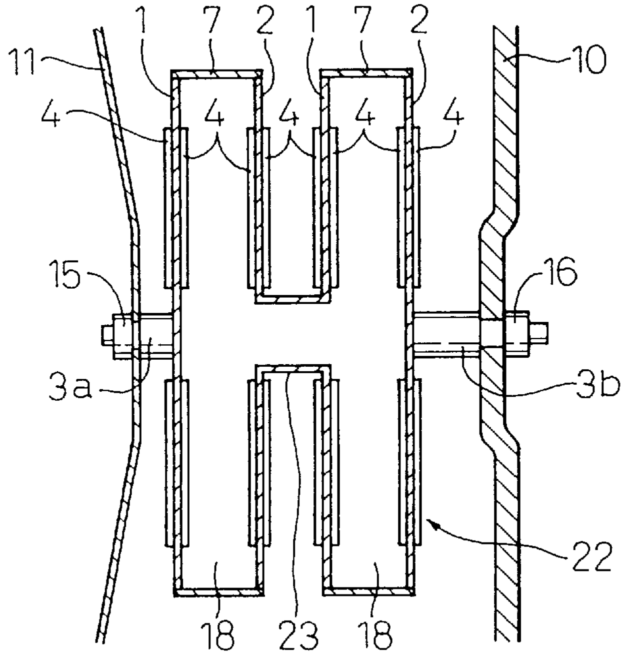
FIG. 19 is a cross-sectional side view of part of a speaker showing a modification of FIG. 18.

FIG. 19 shows a modification of the driving device 22 shown in FIG. 18. In this modification, the centers of the two piezoelectric vibration plates 1 and 2 positioned at the center among the four piezoelectric vibration plates 1 and 2 are connected by a hollow sleeve 23. Accordingly, in this embodiment, the air damper chambers 18 formed in the modules are communicated with each other through the hollow sleeve 23.

Figure 20:
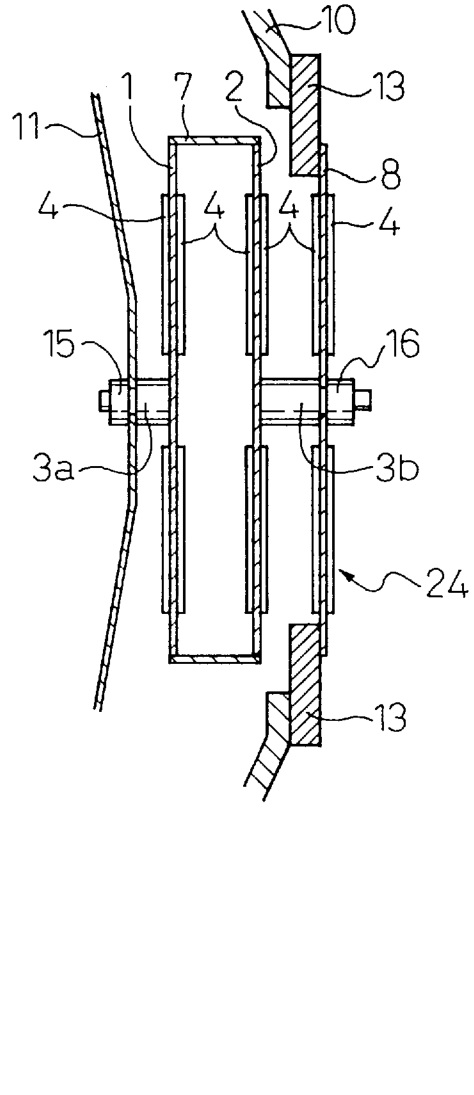
FIG. 20 is a cross-sectional side view of part of a speaker showing still another embodiment.

FIG. 20 shows the case of application of a construction in which use is made of a driving device of the type III shown in FIG. 7 as the driving device of the speaker and use is made of the annular elastic member 13 shown in FIG. 11 to cause attenuation of the high frequency oscillation of the driving device 24. That is, in the driving device 24, the center of the piezoelectric vibration plate 2 constituting part of the type II module and the center of the single piezoelectric vibration plate 8 are connected to each other through a connecting rod 3*b*. The peripheral portion of the single piezoelectric vibration plate 8 is connected to the speaker frame 10 through an annular elastic member 13 comprised of a rubber.

Figure 21:
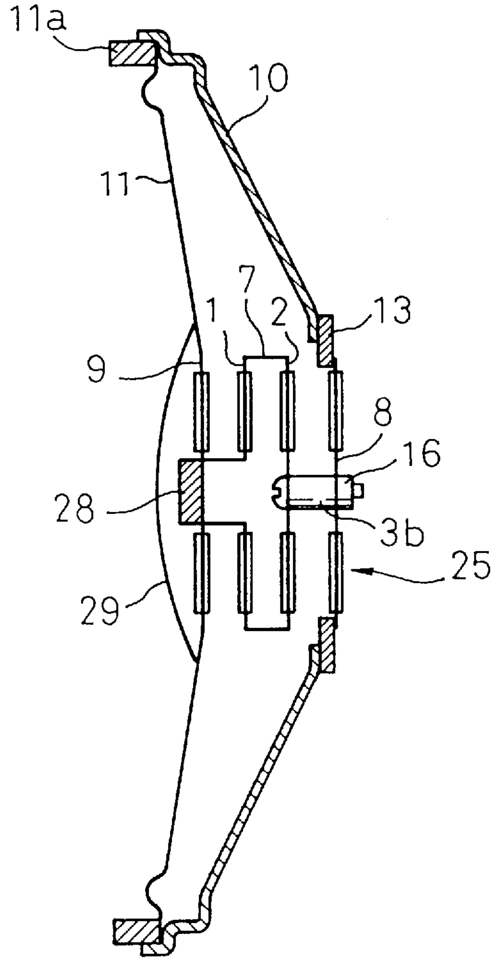
FIG. 21 is a cross-sectional side view of part of a speaker showing still another embodiment.
Figure 22:
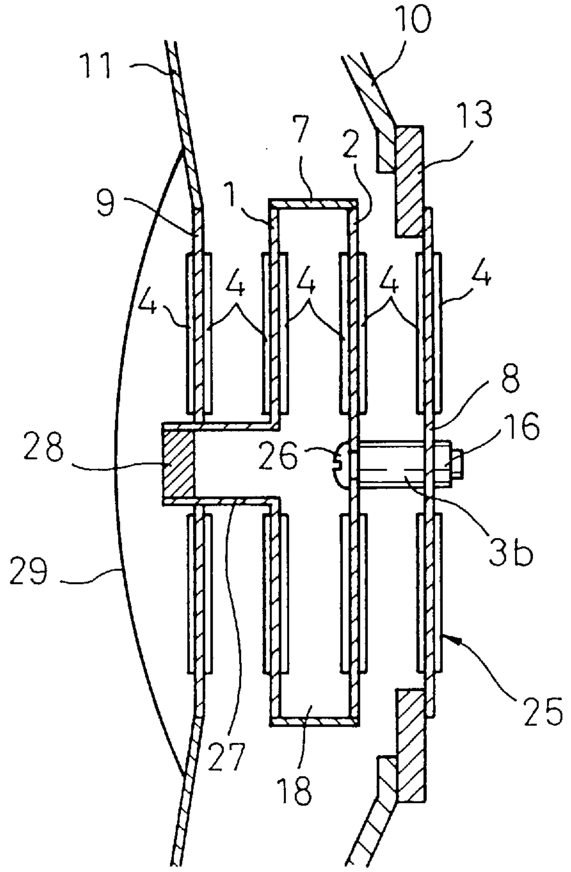
FIG. 22 is a partially enlarged cross-sectional side view of FIG. 21.

FIG. 21 and FIG. 22 show the case of application of a construction in which use is made of a driving device of the type V shown in FIG. 7 as the driving device of the speaker and use is made of the annular elastic member 13 shown in FIG. 11 to cause attenuation of the high frequency vibration of the driving device 25. That is, in the driving device 25, the center of the piezoelectric vibration plate 2 constituting part of the type II module and the center of the single piezoelectric vibration plate 8 are connected to each other through a connecting rod 3*b* by a bolt 26 and nut 16. The peripheral portion of the single piezoelectric vibration plate 8 is connected to the speaker frame 10 through an annular elastic member 13 comprised of a rubber. Further, in this driving device 25, the center of the piezoelectric vibration plate 1 constituting part of the type II module and the center of the single piezoelectric vibration plate 9 are connected to each other through the hollow sleeve 27. The outer periphery of the single piezoelectric vibration plate 9 is connected to the inner periphery of the acoustic vibration plate 11.

Further, in this driving device 25, the front end of the hollow sleeve 27 opens to the outside. The opening of the hollow sleeve 27 is closed off by a plug 28 made of a plastic material, for example. The plug 28 is not inserted before assembling the driving device 25. When the driving device 25 is being assembled, the plug 28 is inserted into the opening of the hollow sleeve 27 after bolting the piezoelectric vibration plates 2 and 8. This forms an air damper chamber 18 between the piezoelectric vibration plates 1 and 2. In this driving device 25, further, a diaphragm 29 is attached to cover the single piezoelectric vibration plate 9.

With this driving device 25, an output stroke four times the case of use of a single piezoelectric vibration plate is obtained. Further, with this driving device 25, the resonance frequency of the driving device 25 becomes much smaller and, further, the high frequency oscillation is attenuated to a large degree by the high frequency attenuation action of the air damper chamber 18 and the high frequency attenuation action of the elastic member 13, so the Q value is made much lower. As a result, it is possible to maintain a high sound pressure level overall and to obtain a flat sound pressure level over a wide frequency region.

Figure 23:
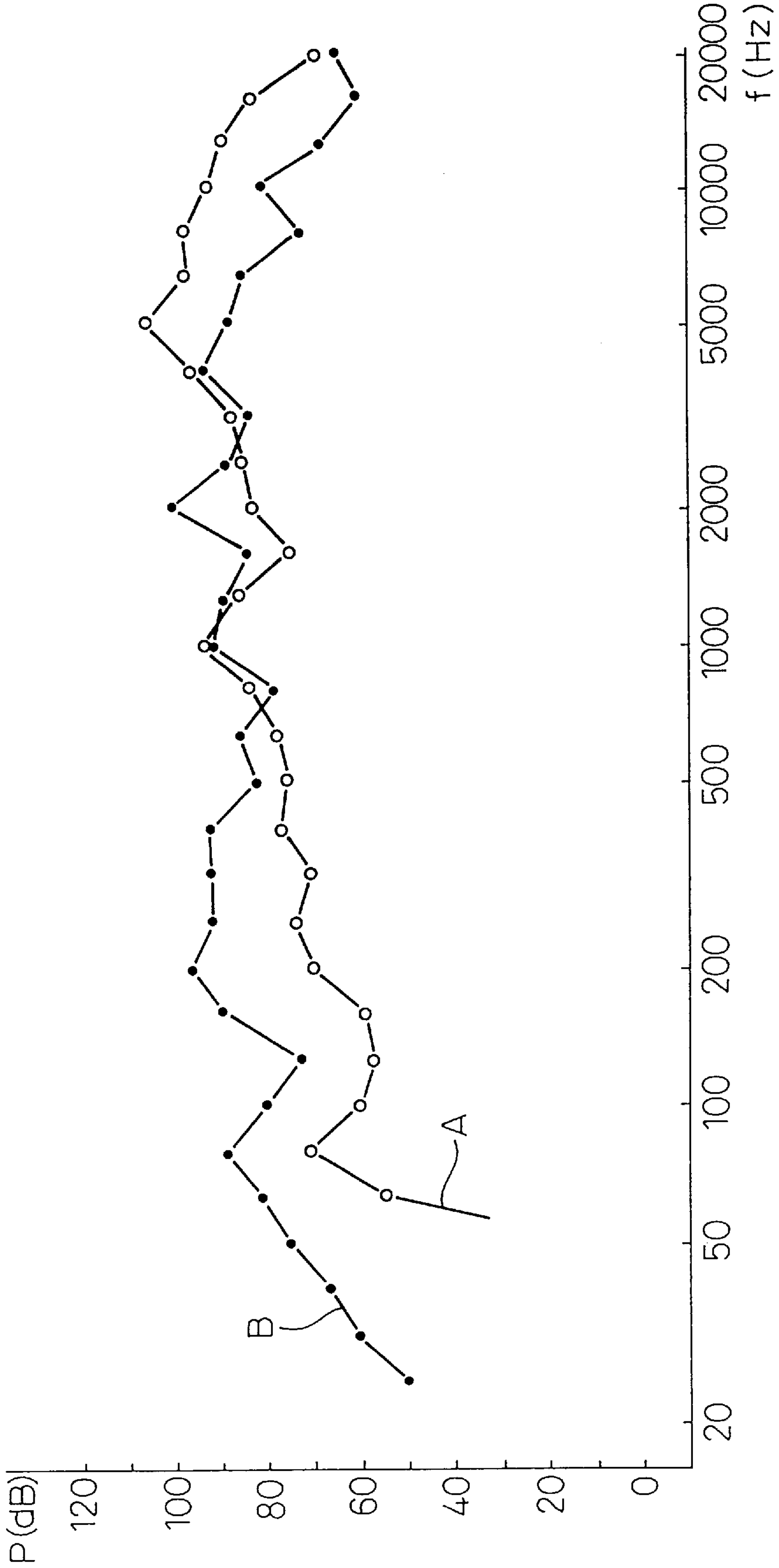
FIG. 23 is a view showing the relationship of the frequency f and the sound pressure level P.

FIG. 23 shows the results of an experiment investigating the relationship between the frequency f and the sound pressure level P. In FIG. 23, A shows a speaker of the construction shown in FIG. 12, while B shows a speaker of the construction shown in FIG. 21. Note that FIG. 23 shows the case of application of a drive voltage giving a substantially equal sound pressure level P at a frequency f of 1000 Hz to the driving devices 14 and 25. From FIG. 23, it is learned that the speaker of the construction shown in FIG. 21 has a flat sound pressure level P across a wide frequency region.

Figure 24:
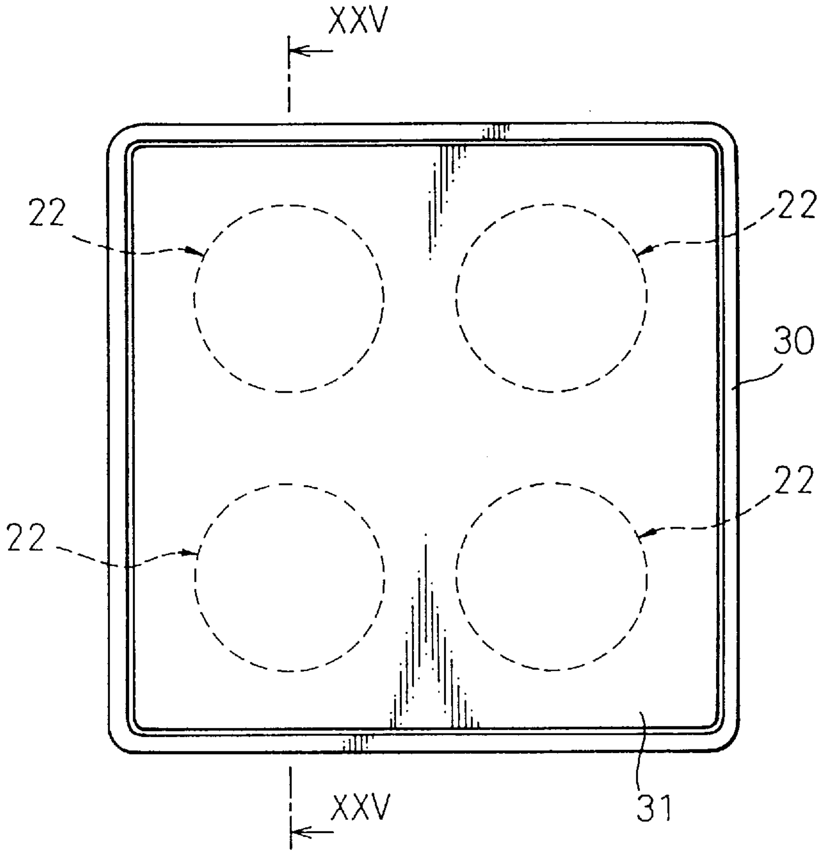
FIG. 24 is a front view of a speaker showing another embodiment.
Figure 25:
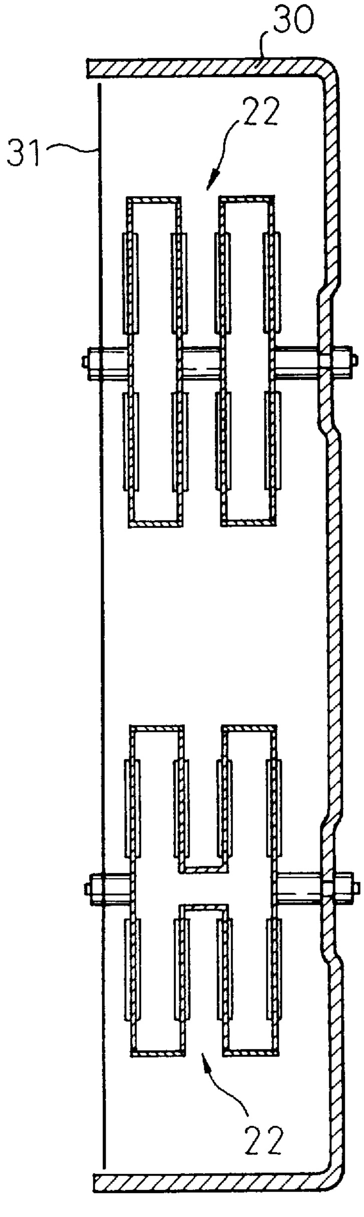
FIG. 25 is a cross-sectional view seen along line XXV—XXV of FIG. 24.

FIG. 24 and FIG. 25 show still another embodiment. Referring to FIG. 24 and FIG. 25, reference numeral 30 shows a speaker frame and 31 shows an acoustic vibration plate. In this embodiment, a plurality of driving devices 22 of the type VI in FIG. 7 are arranged in parallel between the speaker frame 30 and the acoustic vibration plate 31. Accordingly, in this embodiment, the acoustic vibration plate 31 is simultaneously driven by a plurality of driving devices 22. Note that in this case, it is possible to use any of the types of driving devices shown in FIG. 7.

The speaker using the piezoelectric vibration plates of the present invention not only has the advantage of being much lighter in weight compared with the conventional dynamic speakers, but also has the advantage of not requiring the use of permanent magnets as in dynamic speakers and therefore not requiring anti-magnetic devices.

Note that while the present invention was explained heretofore with reference to the case of application to a speaker, the present invention may be applied to all sound generating devices for producing sound, such as telephones or buzzers. Further, needless to say, unimorphs may be used as the piezoelectric vibration plates.

I claim:

1. A sound generating device comprising:

an acoustic vibration plate;

a driving device having a plurality of piezoelectric vibration plates, the central portion of at least one of the piezoelectric vibration plates being connected to said acoustic vibration plate for driving said acoustic vibration plate, wherein said piezoelectric vibration plates are arranged spaced from each other in an axial direction, wherein one of the peripheral and central portions of adjacent piezoelectric vibration plates are connected to each other, adjacent piezoelectric vibration plates being made to flex in opposite directions from each other, the piezoelectric vibration plate positioned at one end of said plurality of piezoelectric vibration plates being connected to an acoustic vibration plate; and an elastic plate member attached to the peripheral portion of said piezoelectric vibration plate and radially extending outward from the periphery of the piezoelectric vibration plate, said elastic plate member being attached to the peripheral portion of said piezoelectric vibration plate positioned at the other end of said plurality of piezoelectric vibration plates.

2. A sound generating device as set forth in claim 1, wherein said driving member has at least one module comprised of a pair of piezoelectric vibration plates connected to each other at peripheral portions thereof.

3. A sound generating device as set forth in claim 2, wherein the central portion of one piezoelectric vibration plate of said pair of piezoelectric vibration plates is connected to an acoustic vibration plate through a connecting rod.

4. A sound generating device as set forth in claim 2, wherein said driving device is provided with a plurality of modules connected in series.

5. A sound generating device as set forth in claim 4, wherein the central portions of the piezoelectric vibration plates of said modules are connected to each other through connecting rods.

6. A sound generating device as set forth in claim 2, wherein said driving device is provided with a single piezoelectric vibration plate arranged adjacent to said module, the central portion of said single piezoelectric vibration plate is connected to the central portions of one piezoelectric vibration plate constituting the module, and the peripheral portion of said single piezoelectric vibration plate is connected to the acoustic vibration plate.

7. A sound generating device as set forth in claim 6, wherein the central portion of said single piezoelectric vibration plate and the central portion of said one piezoelectric vibration plate are connected to each other through a connecting rod.

8. A sound generating device as set forth in claim 6, wherein the central portion of said single piezoelectric vibration plate and the central portion of said one piezoelectric vibration plate are connected to each other through a hollow sleeve communicating an air damper chamber with the outside air and wherein said hollow sleeve is closed by a plug so as to shut off the air damper chamber from the outside air.

9. A sound generating device as set forth in claim 2, wherein the peripheral portions of said pair of piezoelectric vibration plates are connected to each other by an annular spacer extending along the peripheral portions of the piezoelectric vibration plates and wherein an air damper chamber for attenuation of high frequency oscillation enclosed by said annular spacer is formed between said pair of piezoelectric vibration plates.

10. A sound generating device as set forth in claim 9, wherein said driving member is provided with a plurality of modules, the central portions of the piezoelectric vibration plates of mutually adjoining modules are connected to each other by hollow sleeves, and air damper chambers formed in the modules are connected to each other through said hollow sleeves.

11. A sound generating device as set forth in claim 9, wherein through holes for communicating the inside of the air damper chamber with the outside air are formed in at least one of said annular spacer and piezoelectric vibration plates.

12. A sound generating device as set forth in claim 9, wherein said annular spacer is formed from a metal material.

13. A sound generating device as set forth in claim 9, wherein said annular spacer is formed from an elastic material.

14. A sound generating device as set forth in claim 13, wherein said elastic material is comprised of a rubber.

15. A sound generating device comprising:

an acoustic vibration plate;

a driving device having a plurality of piezoelectric vibration plates, the central portion of at least one of the piezoelectric vibration plates being connected to said acoustic vibration plate for driving said acoustic vibration plate, wherein said driving device is comprised of a pair of piezoelectric vibration plates connected to each other at central portions thereof, the peripheral portion of one of said piezoelectric vibration plates being connected to said acoustic vibration plate; and an elastic plate member attached to the peripheral portion of said piezoelectric vibration plate and radially extending outward from the periphery of the piezoelectric vibration plate, said elastic plate member being attached to the peripheral portion of the other piezoelectric vibration plate.

16. A sound generating device comprising:

a frame:

an acoustic vibration plate;

a driving device having at least one piezoelectric vibration plate, wherein a peripheral portion of said at least one piezoelectric vibration plate is connected to said acoustic vibration plate for driving said acoustic vibration plate; and a flexible, elastic plate member attached to a central portion of said piezoelectric vibration plate via a connecting rod and radially extending outward from the connecting rod, wherein the elastic plate member is coupled to the frame only via the central portion of the piezoelectric-vibration plate so that a peripheral portion of the elastic plate member is freely movable with respect to the frame.

17. A sound generating device as set forth in claim 16, wherein said at least one piezoelectric vibration plates includes a plurality of piezoelectric vibration plates which are arranged spaced from each other in an axial direction, one of the peripheral portions and the central portions of adjacent piezoelectric vibration plates being connected to each other, adjacent piezoelectric vibration plates being made to flex in opposite directions from each other, wherein the piezoelectric vibration plate positioned at a first end of said plurality of piezoelectric vibration plates is connected to the acoustic vibration plate, said elastic plate member being attached to the central portion of said one of the piezoelectric vibration plates positioned at a second end of said plurality of piezoelectric vibration plates.

18. A sound generating device as set forth in claim 17, wherein said sound generating device is provided with a frame, and a peripheral portion of the elastic plate member is supported by said frame.

19. A sound generating device as set forth in claim 17, wherein said driving device is provided with a single piezoelectric vibration plate arranged adjacent to said module, a central portion of said single piezoelectric vibration plate being connected to the central portion of one of the piezoelectric vibration plates constituting the module, and wherein the peripheral portion of said single piezoelectric vibration plate is connected to the acoustic vibration plate.

20. A sound generating device as set forth in claim 19, wherein the central portion of said single piezoelectric vibration plate and the central portion of said one of the piezoelectric vibration plates constituting the module are connected to each other through a connecting rod.

21. A sound generating device as set forth in claim 19, wherein the central portion of said single piezoelectric vibration plate and the central portion of said one piezoelectric vibration plate are connected to each other through a hollow sleeve communicating an air damper chamber with the outside air and wherein said hollow sleeve is closed by a plug so as to shut off the air damper chamber from the outside air.

22. A sound generating device as set forth in claim 16, wherein said elastic plate member is made of a rubber material.

23. A sound generating device as set forth in claim 16, wherein said at least one piezoelectric vibration plates includes, wherein the at least one piezoelectric vibration plate comprises at least one module comprised of a pair of piezoelectric vibration plates connected to each other at peripheral portions thereof.

24. A sound generating device as set forth in claim 23, wherein the central portion of one of said piezoelectric vibration plates of the at least one module is connected to said acoustic vibration plate, said elastic plate member being attached to the central portion of the other one of the piezoelectric vibration plates of the at least one module.

25. A sound generating device as set forth in claim 23, wherein the peripheral portions of said pair of piezoelectric vibration plates of the at least one module are connected to each other by an annular spacer extending along the peripheral portion of each of the piezoelectric vibration plates and wherein an air damper chamber for attenuation of high frequency oscillation enclosed by said annular spacer is formed between said pair of piezoelectric vibration plates.

26. A sound generating device as set forth in claim 25, wherein said driving member is provided with a plurality of modules and wherein central portions of the piezoelectric vibration plates of mutually adjoining modules are connected to each other by hollow sleeves, and wherein air damper chambers formed within each of the modules are connected to each other through said hollow sleeves.

27. A sound generating device as set forth in claim 25, wherein through holes for communicating the inside of the air damper chamber with the outside air are formed in at least one of said annular spacer and said piezoelectric vibration plates.

28. A sound generating device as set forth in claim 25, wherein said annular spacer is formed from a metal material.

29. A sound generating device as set forth in claim 25, wherein said annular spacer is formed from an elastic material.

30. A sound generating device as set forth in claim 29, wherein said elastic material is comprised of a rubber material.

31. A sound generating device-as set forth in claim 23, wherein said driving device is provided with a plurality of modules connected in series.

32. A sound generating device as set forth in claim 31, wherein the centers of the piezoelectric vibration plates-of said modules are connected to each other through connecting rods.

33. A sound generating device as set forth in claim 16, wherein said piezoelectric vibration plate is comprised of a bimorph.

34. A sound generating device comprising:

a frame;

an acoustic vibration plate;

a driving device having at least one piezoelectric vibration plate, the central portion of said piezoelectric vibration plate being connected to said acoustic vibration plate for driving said acoustic vibration plate; and an elastic, flexible plate member, a central portion of which is attached to the peripheral portion of said piezoelectric vibration plate, wherein the elastic plate member extends radially outward from the periphery of the piezoelectric vibration plate and wherein the elastic plate member is coupled to the frame only via the piezoelectric vibration plate so that a peripheral portion of the elastic plate member is freely movable with respect to the frame.

35. A sound generating device as set forth in claim 1, wherein said sound generating device is provided with a frame, and the peripheral portion of the elastic plate member is supported by said frame.

36. A sound generating device as set forth in claim 34, wherein said elastic plate member is made of a rubber.

37. A sound generating device as set forth in claim 34, wherein a plurality of driving devices are provided in parallel with respect to the acoustic vibration plate so as to drive the acoustic vibration plate.

38. A sound generating device as set forth in claim 34, wherein said piezoelectric vibration plate is comprised of a bimorph.

* * * * *

UNITED STATES PATENT AND TRADEMARK OFFICE

CERTIFICATE OF CORRECTION

PATENT NO. : 5,804,906

DATED : September 8, 1998

INVENTOR(S) : Shigeru TSUTSUMI

It is certified that error appears in the above-identified patent and that said Letters Patent is hereby corrected as shown below:

Column 1, line 63, befire "perspective" insert --a--.

Column 1, line 67, before "view" insert --a--.

Column 9, line 22, delete "on".

Column 13, line 38, change "plates" to --plate--.

Column 14, line 22, change "plates-of" to --plates of--.

Signed and Sealed this

Eighteenth Day of May, 1999

Attest:

Q. TODD DICKINSON

*Attesting Officer*

*Acting Commissioner of Patents and Trademarks*